United States Patent
Kitamura et al.

(10) Patent No.: US 11,936,223 B2
(45) Date of Patent: Mar. 19, 2024

(54) BATTERY POLARITY DETERMINATION CIRCUIT, CHARGER, AND ELECTRONIC DEVICE

(71) Applicant: FDK CORPORATION, Tokyo (JP)

(72) Inventors: Kenji Kitamura, Tokyo (JP); Yasunari Mizoguchi, Tokyo (JP); Takashi Kanou, Tokyo (JP)

(73) Assignee: FDK CORPORATION, Tokyo (JP)

( * ) Notice: Subject to any disclaimer, the term of this patent is extended or adjusted under 35 U.S.C. 154(b) by 544 days.

(21) Appl. No.: 17/290,772

(22) PCT Filed: Sep. 20, 2019

(86) PCT No.: PCT/JP2019/036872
§ 371 (c)(1),
(2) Date: May 2, 2021

(87) PCT Pub. No.: WO2020/115990
PCT Pub. Date: Jun. 11, 2020

(65) Prior Publication Data
US 2021/0376617 A1    Dec. 2, 2021

(30) Foreign Application Priority Data
Dec. 6, 2018 (JP) .................. 2018-229152

(51) Int. Cl.
*G01R 19/14* (2006.01)
*G01R 31/3832* (2019.01)
(Continued)

(52) U.S. Cl.
CPC ............ *H02J 7/0034* (2013.01); *G01R 19/14* (2013.01); *G01R 31/3832* (2019.01);
(Continued)

(58) Field of Classification Search
CPC ... G01R 19/14; G01R 31/3832; H01M 10/44; H01M 10/441; H01M 10/48;
(Continued)

(56) References Cited

U.S. PATENT DOCUMENTS

| 8,054,049 B1* | 11/2011 | Michaelis | H02J 7/0036 320/165 |
| 2009/0243546 A1* | 10/2009 | Sakurai | H02J 7/0034 320/134 |
| 2014/0368155 A1* | 12/2014 | Chen | H02J 7/0034 307/9.1 |

FOREIGN PATENT DOCUMENTS

| JP | H0739076 A | 2/1995 |
| JP | 2006320154 A | 11/2006 |
| JP | 2018153034 A | 9/2018 |

OTHER PUBLICATIONS

International Search Report and Written Opinion dated Oct. 15, 2019, for corresponding PCT Application No. PCT/ JP2019/036872.

* cited by examiner

*Primary Examiner* — Richard Isla
*Assistant Examiner* — Johali A Torres Ruiz
(74) *Attorney, Agent, or Firm* — Kinney & Lange, P.A.

(57) ABSTRACT

A battery polarity determination circuit includes a battery accommodating unit including a first contact and a second contact to be in contact with respective electrode terminals of a battery, a control device that is connected via a resistor to a voltage lead-out point at which a voltage of the battery is led out and determines a polarity of the battery, a connection switching circuit capable of switching between a first connection state and a second connection state, and a diode having a cathode to be connected to a voltage read-in point at which the resistor and the control device are
(Continued)

connected to each other, and an anode to be grounded, wherein the control device determines the polarity of the battery based on a voltage at the voltage read-in point according to the connection state of the connection switching circuit, and a forward voltage of the diode is set so that the voltage at the voltage read-in point is not less than a lower limit value of an absolute maximum rating of the control device.

8 Claims, 3 Drawing Sheets

(51) Int. Cl.
  *H01M 10/44* (2006.01)
  *H01M 10/48* (2006.01)
  *H01M 50/202* (2021.01)
  *H02J 7/00* (2006.01)
(52) U.S. Cl.
  CPC ......... *H01M 10/441* (2013.01); *H01M 10/48* (2013.01); *H01M 10/482* (2013.01); *H01M 50/202* (2021.01); *H02J 7/0014* (2013.01)
(58) Field of Classification Search
  CPC .. H01M 10/482; H01M 50/202; H02J 7/0014; H02J 7/0034; H02J 7/0049; Y02E 60/10; H02H 11/002
  See application file for complete search history.

ial Field

The present disclosure relates to a battery polarity determination circuit, a charger and an electronic device.

Background Art

Generally, cylindrical dry batteries and secondary batteries are widely used as power sources for various electronic devices. Further, the secondary batteries can be used repeatedly by charging, and chargers are widely used as devices for charging the secondary batteries. When a battery is installed in such an electronic device or charger, it is necessary to check the polarity of the battery. In other words, it is necessary to install the battery in the electronic device or the charger in a correct connecting direction in which a positive electrode terminal comes into contact with a contact to which the positive electrode terminal should contact, and a negative electrode terminal comes into contact with a contact to which the negative electrode terminal should contact.

However, since electronic devices and chargers are often configured so that batteries can be installed even if the connecting direction is reverse, the batteries may be installed in a connecting direction reverse to a correct connecting direction. When the batteries are installed in the connecting direction reverse to the correct connecting direction, the electronic devices fail to operate, and in the case of the chargers, not only the batteries cannot be charged, but also the batteries may leak or the like, for example.

As an example of a conventional technique which has an object to solve such a problem, for example, Patent Document 1 discloses a charger in which the connecting direction of a battery is determined by a pair of photocouplers for detecting the presence or absence of current flowing from a positive electrode terminal and a negative electrode terminal of the battery, respectively. Further, for example, Patent Document 2 discloses a charger and an electronic device which include a pair of operational amplifiers for comparing the voltages of a positive electrode terminal and a negative electrode terminal of a battery, and determine the connecting direction of the battery based on the relationship in magnitude between the output voltages of the pair of operational amplifiers.

PRIOR ART DOCUMENT

Patent Document
Patent Document 1: Japanese Patent Laid-Open No. 7-39076
Patent Document 2: Japanese Patent Laid-Open No. 2018-153034

SUMMARY

However, since all of the above-mentioned conventional techniques use relatively expensive electronic components such as photocouplers or operational amplifiers, there is a risk that cost reduction of chargers and electronic devices may be hindered. On the other hand, for the purpose of cost reduction, it is conceivable that the voltage of the battery is directly read by a control device without using these relatively expensive electronic components. However, in this case, the control device may be damaged because a voltage outside an absolute maximum rating range is applied to the control device depending on the connecting direction of the battery.

The present disclosure has been made in view of such a situation, and has an object to provide a battery polarity determination circuit, a charger, and an electronic device which can determine a battery polarity at low cost while reducing the risk of damage.

In order to achieve the above object, a battery polarity determination circuit according to the present disclosure comprises: a battery accommodating unit including a first contact and a second contact to be in contact with respective electrode terminals of a battery accommodated in the battery accommodating unit; a control device that is connected via a resistor to a voltage lead-out point at which a voltage of the battery is led out from the battery accommodating unit and determines a polarity of the battery accommodated in the battery accommodating unit; a connection switching circuit capable of switching between a first connection state in which the first contact is connected to the voltage lead-out point and the second contact is grounded, and a second connection state in which the second contact is connected to the voltage lead-out point and the first contact is grounded; and a diode having a cathode to be connected to a voltage read-in point at which the resistor and the control device are connected to each other, and an anode to be grounded, wherein the control device determines the polarity of the battery based on a voltage at the voltage read-in point according to the connection state of the connection switching circuit, and a forward voltage of the diode is set so that the voltage at the voltage read-in point is not less than a lower limit value of an absolute maximum rating of the control device.

According to the present disclosure, there can be provided a battery polarity determination circuit, a charger, and an electronic device which can determine a battery polarity at low cost while reducing the risk of damage.

DETAILED DESCRIPTION

Hereinafter, embodiments of the present disclosure will be described in detail with reference to the drawings. Note that the present invention is not limited to the contents described below, and can be arbitrarily modified and implemented without changing the scope thereof. Further, all of the drawings used to describe the embodiments schematically show constituent members and are partially emphasized, enlarged, reduced, or omitted in order to deepen the understanding of the constituent members. Therefore, the drawings may not accurately represent the scales, shapes, etc. of the constituent elements.

First Embodiment

Figure 1:
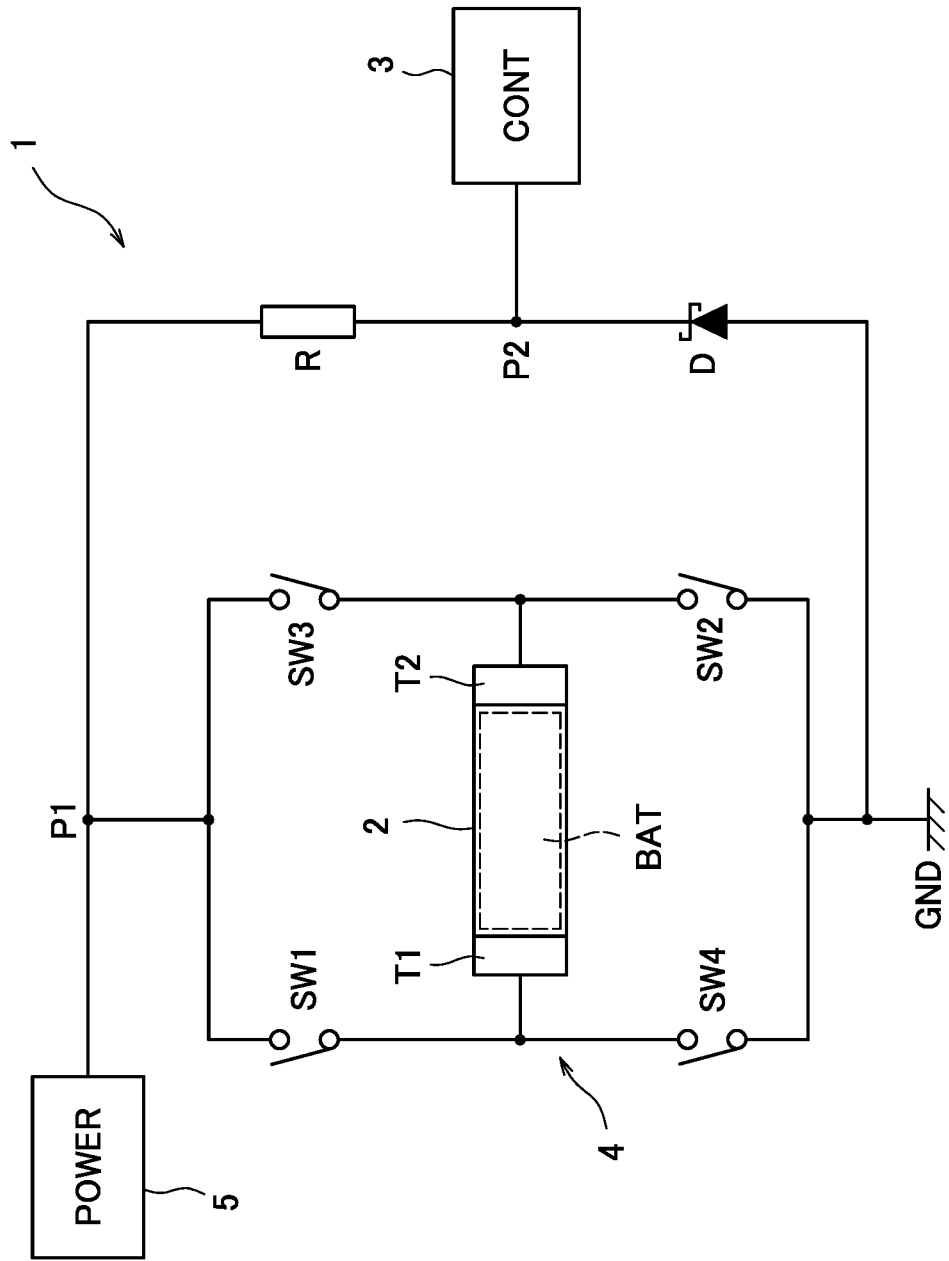
FIG. 1 is a circuit diagram of a charger according to a first embodiment of the present disclosure.

FIG. 1 is a circuit diagram of a charger 1 according to a first embodiment of the present disclosure. The charger 1 according to the present embodiment includes a battery accommodating unit 2, a control device 3, a connection switching circuit 4, a resistor R, a "battery polarity determination circuit" including a diode D, and a power supply circuit 5. The charger 1 determines the polarity of a battery BAT accommodated in the battery accommodating unit 2, that is, the connecting direction of the battery BAT, and charges the battery BAT in an appropriate connecting direction.

The battery accommodating unit 2 includes a first contact T1 and a second contact T2 that come into contact with the respective electrode terminals of the battery BAT to be accommodated. In other words, when the battery BAT is accommodated in the battery accommodating unit 2 so that a positive electrode terminal is in contact with the first contact T1, a negative electrode terminal is in contact with the second contact T2. When the battery BAT is accommodated in the battery accommodating unit 2 so that the negative electrode terminal is in contact with the first contact T1, the positive electrode terminal is in contact with the second contact T2. Here, in the present embodiment, the battery BAT is assumed to be a nickel-metal hydride secondary battery having a nominal voltage of 1.2 [V].

The control device 3 includes, for example, a known microcomputer control circuit, and as will be described in detail later, it performs integral control including the polarity determination of the battery BAT and the charge control of the battery BAT on the entire charger 1. Further, the control device 3 of the present embodiment has a built-in AD converter (not shown) for converting an analog voltage on the circuit into a digital voltage and reading the digital voltage. Here, in the present embodiment, it is assumed that a general absolute maximum rating in which a power supply voltage $V_{DD}$ on the high potential side is equal to 5 [V], a power supply voltage $V_{SS}$ on the low potential side is equal to 0 [V], and an allowable input voltage is in the range of $V_{SS}-0.3$ [V]$\leq V_{IN}\leq V_{DD}+0.3$ [V] is defined in the control device 3.

The connection switching circuit 4 is a circuit for switching the connection state of the battery accommodating unit 2 having the battery BAT accommodated therein between a voltage lead-out point P1 and a grounding point GND shown in FIG. 1. More specifically, the connection switching circuit 4 includes a first switch SW1, a second switch SW2, a third switch SW3, and a fourth switch SW4, which comprise, for example, field effect transistors (FETs). One end of the first switch SW1 is connected to the first contact T1, and the other end of the first switch SW1 is connected to the voltage lead-out point P1. One end of the second switch SW2 is connected to the second contact T2, and the other end of the second switch SW2 is grounded. One end of the third switch SW3 is connected to the second contact T2, and the other end of the third switch SW3 is connected to the voltage lead-out point P1. One end of the fourth switch SW4 is connected to the first contact T1, and the other end of the fourth switch SW4 is grounded.

As a result, the connection switching circuit 4 can switch, for example, between a first connection state in which the first contact T1 is connected to the voltage lead-out point P1 and the second contact T2 is grounded, and a second connection state in which the second contact T2 is connected to the voltage lead-out point P1 and the first contact T1 is grounded. Note that each switch of the connection switching circuit 4 is controlled to be connected/disconnected by the control device 3.

One end of the resistor R is connected to the voltage lead-out point P1, and the other end of the resistor R is connected to a voltage read-in point P2 as a connection point with the control device 3. The resistor R limits the current flowing between the voltage lead-out point P1 and the voltage read-in point P2.

The diode D is a Schottky barrier diode in the present embodiment, a cathode thereof is connected to the voltage read-in point P2 and an anode thereof is grounded. Current flows in a forward direction through the diode D when the voltage of the anode is higher than the sum of the voltage of the cathode and a predetermined forward voltage $V_F$. Here, for the diode D according to the present disclosure, the forward voltage $V_F$ is set so that the voltage $V_{P2}$ at the voltage read-in point P2 is equal to or more than −0.3 [V] which is the lower limit value of the absolute maximum rating of the control device 3. In the present embodiment, the description will be made on the assumption that a Schottky barrier diode having a forward voltage $V_F=0.3$ [V] is used, but a lower $V_F$ type Schottky barrier diode may be adopted. When the lower limit value of the absolute maximum rating of the control device 3 is further lower, a rectifying element other than the Schottky barrier diode may be adopted.

The power supply circuit 5 outputs charging power for charging the battery BAT to the voltage lead-out point P1 based on the control by the control device 3. More specifically, the power supply circuit 5 is, for example, a DC-DC converter for converting power supplied from an external power source (not shown) into a voltage suitable for charging the battery BAT based on the control by the control device 3 that monitors the state of the battery BAT.

Figure 2:
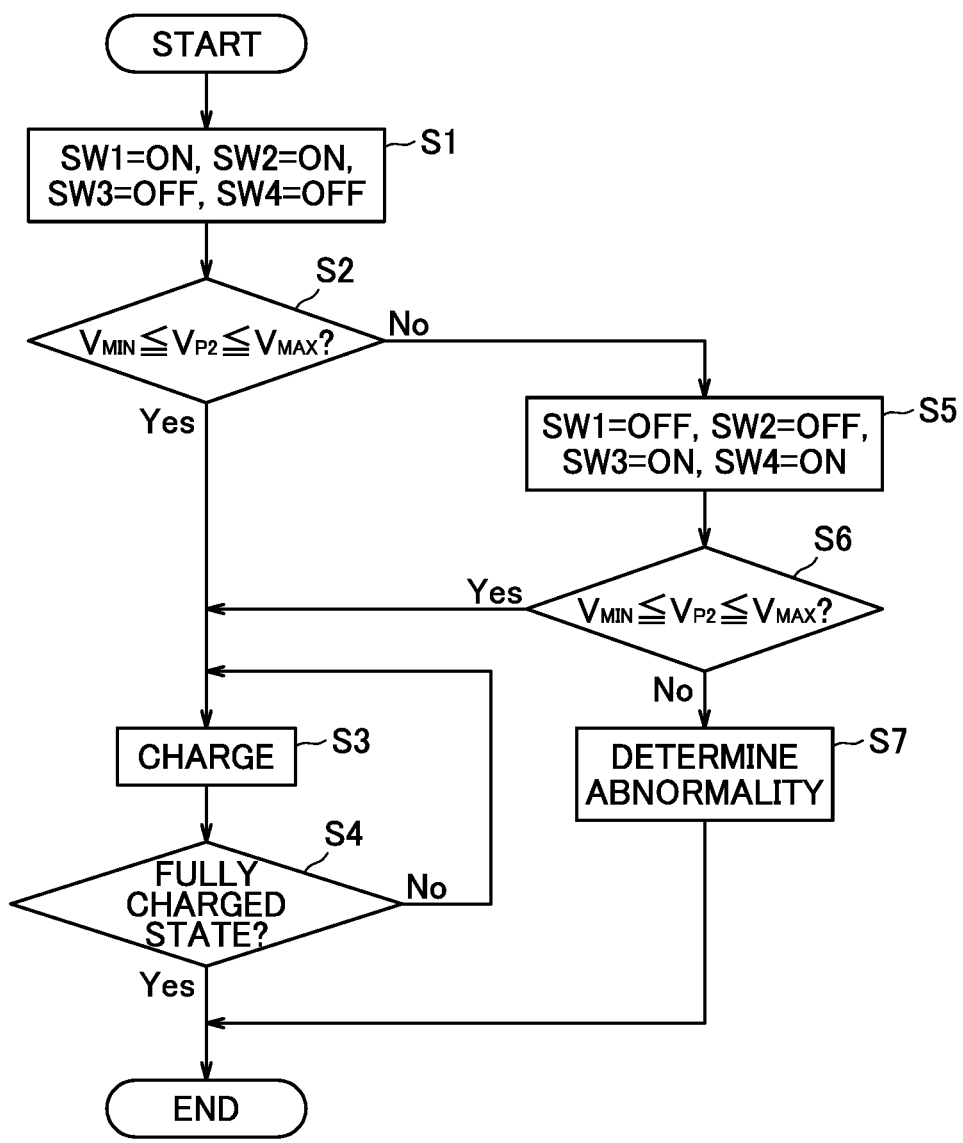
FIG. 2 is a flowchart showing a control operation of a control device.

Next, an example of a control procedure of the control device 3 for determining the polarity of the battery BAT accommodated in the battery accommodating unit 2 and charging the battery BAT will be described. FIG. 2 is a flowchart showing a control operation of the control device 3. The control device 3 starts the control of FIG. 2 in a state where the battery BAT is accommodated in the battery accommodating unit 2. Here, at the start time of the control, it is assumed that all of the switches of the connection switching circuit 4 are set to OFF and the power supply circuit 5 outputs no charging power.

When the control operation is started, the control device 3 controls the first switch SW1 and the second switch SW2 to be set to ON, and controls the third switch SW3 and the fourth switch SW4 to be set to OFF (step S1). As a result, the battery accommodating unit 2 falls into the above-mentioned first connection state in which the first contact T1 is connected to the voltage lead-out point P1 and the second contact T2 is grounded.

Here, when the battery BAT is accommodated in the battery accommodating unit 2 in a direction where the positive electrode terminal of the battery BAT is in contact with the first contact T1, a voltage $V_{P1}$ at the voltage lead-out point P1 is equal to about 1.2 [V] as the voltage of the battery BAT which is connected in the forward direction under the first connection state. At this time, a circuit extending from the voltage lead-out point P1 via the resistor R, the voltage read-in point P2, and the diode D to the ground falls into a state where no current flows because a voltage in a reverse direction is applied to the diode D. Therefore, the voltage $V_{P2}$ at the voltage read-in point P2 is equal to about 1.2 [V] which is the same as the voltage lead-out point P1 because it is not subjected to a voltage drop in the resistor R.

Further, when the battery BA is accommodated in the battery accommodating unit 2 in a direction where the negative electrode terminal of the battery BAT is in contact with the first contact T1, the voltage $V_{P1}$ at the voltage lead-out point P1 is equal to about −1.2 [V] as the voltage of the battery BAT which is connected in the reverse direction under the first connection state. At this time, a circuit extending from the voltage lead-out point P1 via the resistor R, the voltage read-in point P2, and the diode D to the ground falls in a state where current flows because a voltage in a forward direction is applied to the diode D. Therefore, the voltage $V_{P2}$ at the voltage read-in point P2 is equal to −0.3 [V] depending on the magnitude of the forward voltage $V_F$ of the diode D as a voltage to which a voltage drop in the resistor R is added with respect to the voltage at the voltage lead-out point P1. At this time, as the resistor R is adopted a resistor having such a resistance value r that the current flowing from the diode D does not exceed the allowable current of the diode D.

As described above, by reading the voltage $V_{P2}$ at the voltage read-in point P2 in the state where the connection switching circuit 4 is controlled to be in the first connection state, the control device 3 can determine whether the battery BAT is accommodated in the battery accommodating unit 2 in the state where the positive electrode terminal is in contact with the first contact T1. More specifically, the control device 3 determines whether the voltage $V_{P2}$ at the voltage read-in point P2 is within a predetermined voltage range ($V_{MIN} \leq V_{P2} \leq V_{MAX}$) (step S2). Here, the predetermined voltage range is a range that defines a voltage fluctuation region of a normal battery BAT. In the case of the nickel-metal hydride secondary battery in the present embodiment, for example, a lower limit value $V_{MIN}$ is set to 1.0 [V] as a discharge end voltage, and an upper limit value $V_{MAX}$ is set to 1.3 [V] as a charge end voltage.

When the voltage $V_{P2}$ at the voltage read-in point P2 in the first connection state is within the predetermined voltage range (Yes in step S2), the control device 3 recognizes that the battery BAT is connected in the forward direction under the first connection state, and controls the power supply circuit 5 to output charging power, thereby charging the battery BAT in the first connection state (step S3).

Further, the control device 3 monitors the voltage of the battery BAT (=the voltage $V_{P1}$ at the voltage lead-out point P1=the voltage $V_{P2}$ at the voltage lead-out point P2) based on the voltage $V_{P2}$ at the voltage lead-out point P2, and determines based on the value of the voltage or an index such as a variation amount ΔV thereof whether the battery BAT has reached a fully charged state (step S4). The control device 3 continues to charge the battery BAT until the battery BAT has reached the fully charged state (No in step S4).

When the battery BAT has reached the fully charged state (Yes in step S4), the control device 3 stops supply of charging power by the power supply circuit 5, and controls each switch of the connection switching circuit 4 to be set to OFF, whereby the charging of the battery BAT is terminated and a series of control procedures is completed. At this time, the control device 3 may notify the user of the normal end of charging.

On the other hand, in step S2, when the voltage $V_{P2}$ of the voltage read-in point P2 in the first connection state is not within the predetermined voltage range (No in step S2), the control device 3 controls the first switch SW1 and the second switch SW2 to be set to OFF, and controls the third switch SW3 and the fourth switch SW4 to be set to ON (step S5). As a result, the battery accommodating unit 2 is set to the above-mentioned second connection state in which the second contact T2 is connected to the voltage lead-out point P1 and the first contact T1 is grounded.

The control device 3 reads in the voltage $V_{P2}$ at the voltage read-in point P2 in the state where the connection switching circuit 4 is controlled to be in the second connection state, thereby determining whether the battery BAT is accommodated in the battery accommodating unit 2 in the state where the positive electrode terminal is in contact with the second contact T2. More specifically, the control device 3 determines whether the voltage $V_{P2}$ at the voltage read-in point P2 is within the above-mentioned predetermined voltage range in the second connection state (step S6).

When the voltage $V_{P2}$ at the voltage read-in point P2 in the second connection state is within the predetermined voltage range (Yes in step S6), the control device 3 recognizes that the battery BAT is connected in the forward direction under the second connection state, and as described above, charges the battery BAT until the battery BAT has been fully charged (step S3, step S4).

On the other hand, when the voltage $V_{P2}$ at the voltage read-in point P2 in the second connection state is not within the predetermined voltage range (No in step S6), the control device 3 recognizes that it is impossible to normally charge the battery BAT due to a battery BAT failure, a contact failure of the battery BAT in the battery accommodating unit 2 or the like, makes an abnormality determination (step S7), and then completes a series of control procedures. At this time, the control device 3 may notify the user of an abnormal end of charging.

Here, when a secondary battery is subjected to frequent repeat of shallow charging/discharging, the battery capacity thereof may be apparently reduced due to a so-called memory effect, and a dischargeable capacity may be substantially reduced. The apparent reduction in battery capacity due to this memory effect can be eliminated, for example, by refresh discharge in which the secondary battery is deeply discharged. The battery polarity determination circuit according to the present disclosure can also perform the refresh discharge without adding any new configuration to the circuit shown in FIG. 1.

More specifically, when refresh discharge is required, the control device 3 discharges the battery BAT until a discharge end voltage during a period of time from the determination of the polarity of the battery BAT in step S2 or step S5 until the start of charging in step S3. In other words, after determining the polarity of the battery BAT, the control device 3 controls the connection switching circuit 4 so that the battery BAT falls into a reverse bias connection state in which the positive electrode terminal of the battery BAT is grounded in the first connection state or the second connection state described above.

For example, when it is determined that the positive electrode terminal is in contact with the second contact T2, the control device 3 controls the first switch SW1 and the second switch SW2 to be set to ON, and controls the third switch SW3 and the fourth switch SW4 to be set to OFF, thereby forming the first connection state. As a result, in the battery polarity determination circuit, a closed circuit for connecting the second contact T2, the second switch SW2, the diode D, the resistor R, the first switch SW1, and the first contact T1 in this order is formed, so that the charge capacity of the battery BAT is consumed by the resistor R.

Further, at this time, the control device 3 can perform refresh discharge with a discharge current suitable for the characteristics of the battery BAT by performing discharging while repeatedly switching, under PWM control, between the above-mentioned reverse bias connection state and an open state in which all the switches are set to OFF to open both the first contact T1 and the second contact T2.

As described above, the charger 1 according to the first embodiment of the present disclosure can determine the polarity of the battery BAT based on the voltage $V_{P2}$ at the voltage read-in point P2 as the connection point between the resistor R and the diode D while controlling the connection switching circuit 4 for switching the connection state of the battery BAT, and charge the battery BAT in an appropriate connecting direction. At this time, since the circuit for determining the polarity of the battery BAT consists of only relatively inexpensive elements such as the resistor R and the diode D, the circuit can be configured at low cost as compared with a circuit using relatively expensive electronic components such as a photocoupler and an operational amplifier. In addition, the mounting area of the circuit on the circuit board can be reduced, which can contribute to miniaturization. Further, in the charger 1 according to the first embodiment of the present disclosure, the forward voltage $V_F$ of the diode D is set based on the absolute maximum rating of the control device 3, so that a voltage exceeding the absolute maximum rating can be prevented from being input to the control device 3 regardless of the connecting direction between the control device 3 and the battery BAT. Therefore, according to the charger 1 of the first embodiment of the present disclosure, the battery polarity can be determined at low cost while reducing the risk of damage.

Second Embodiment

Figure 3:
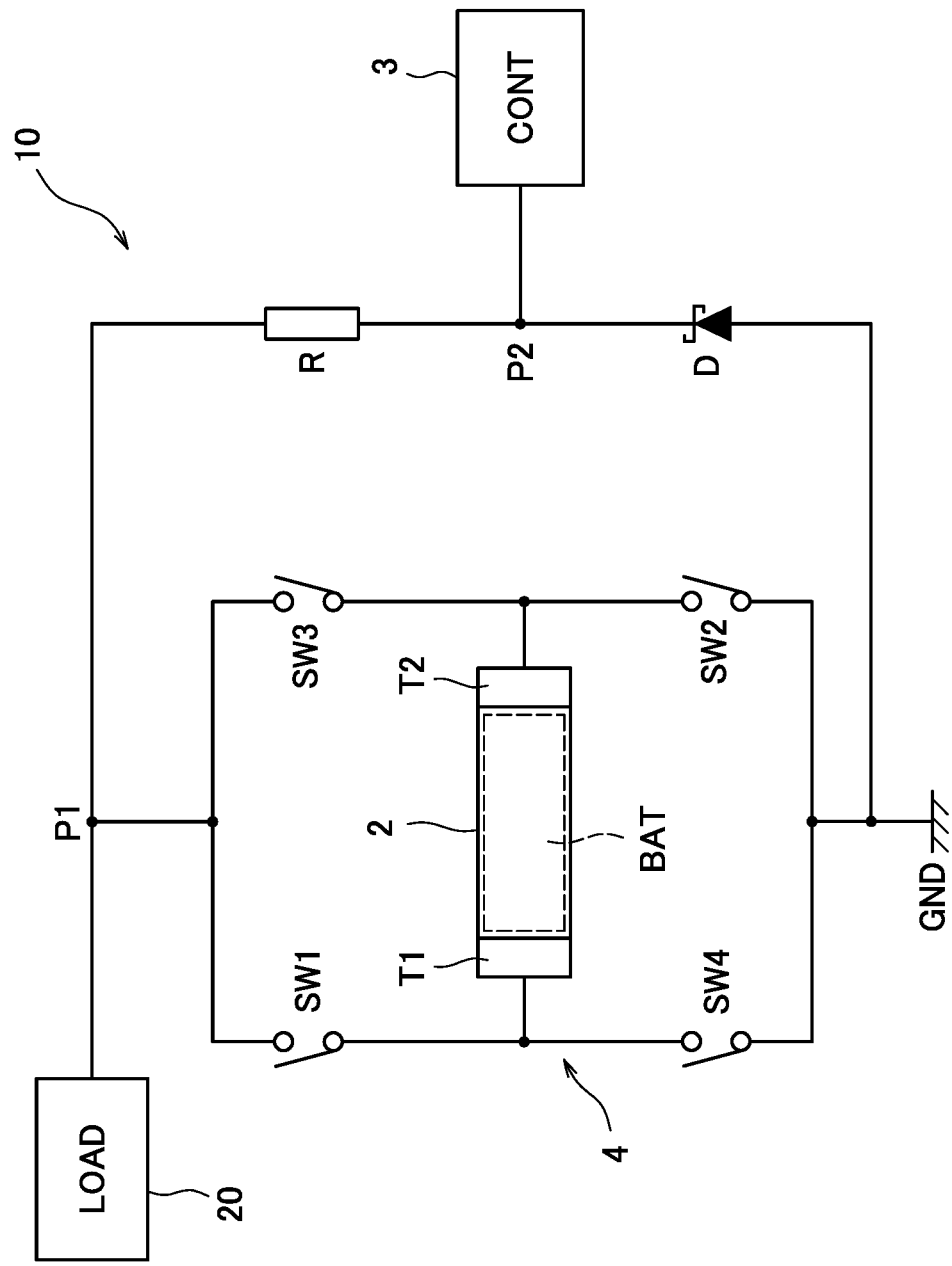
FIG. 3 is a circuit diagram of an electronic device according to a second embodiment of the present disclosure.

Subsequently, an electronic device provided with a battery polarity determination circuit according to the present disclosure will be described as a second embodiment with reference to FIG. 3. FIG. 3 is a circuit diagram of an electronic device 10 according to the second embodiment of the present disclosure. The electronic device 10 according to the second embodiment is different in circuit configuration from that of the first embodiment in that it includes a load device 20 in place of the power supply circuit 5 in the charger 1 of the first embodiment described above. Hereinafter, portions different from those of the first embodiment will be described. Components which are common to the first embodiment are designated by the same reference signs, and detailed description thereof will be omitted.

The electronic device 10 according to the second embodiment operates with power supplied from the battery BAT to the load device 20 upon accommodation of the battery BAT into the battery accommodating unit 2. Here, the electronic device 10 determines the polarity of the battery BAT by the battery polarity determination circuit provided therein like the charger 1 of the first embodiment described above. The control device 3 can supply power from the battery BAT to the load device 20 by controlling the connection switching circuit 4 to be set to a connection state in which the voltage $V_{P2}$ at the voltage read-in point P2 is equal to the voltage of the battery BAT in the first connection state or the second connection state described above, that is, a connection state where the positive electrode terminal of the battery BAT is connected to the first contact T1.

As a result, according to the electronic device 10 of the second embodiment of the present disclosure, even when the battery BAT accommodated in the battery accommodating unit 2 is oriented in any direction, the battery BAT can be discharged in an appropriate connecting direction after the polarity of the battery BAT has been determined. Further, in the electronic device 10, the circuit for determining the polarity of the battery BAT consists of only relatively inexpensive elements, and a voltage exceeding the absolute maximum rating is prevented from being input to the control device 3. Therefore, according to the electronic device 10 of the second embodiment of the present disclosure, the battery polarity can be determined at low cost while reducing the risk of damage.

Although the description of the embodiments is completed above, the present disclosure is not limited to each of the embodiments described above. For example, in the first embodiment described above, the control procedure of performing the control to achieve the first connection state in step S1 before the control to achieve the second connection state in step S3 of FIG. 2 is exemplified. However, the control order between step S1 and step S3 may be reversed. Further, for example, in the first embodiment described above, the control procedure of starting charging based on the voltage $V_{P2}$ of the voltage read-in point P2 being within the predetermined voltage range in the first connection state is exemplified (Yes in step S2 of FIG. 2). However, by reading the voltage $V_{P2}$ at the voltage read-in point P2 in the second connection state immediately after the voltage $V_{P2}$ at the voltage read-in point P2 in the first connection state is read, whether it is possible to charge the battery BAT may be determined in addition to the polarity of the battery BAT at an initial stage of the control procedure.

Aspects of the Present Disclosure

A first aspect of the present disclosure is a battery polarity determination circuit comprising: a battery accommodating unit including a first contact and a second contact to be in contact with respective electrode terminals of a battery accommodated in the battery accommodating unit; a control device that is connected via a resistor to a voltage lead-out point at which a voltage of the battery is led out from the battery accommodating unit and determines a polarity of the battery accommodated in the battery accommodating unit; a connection switching circuit capable of switching between a first connection state in which the first contact is connected to the voltage lead-out point and the second contact is grounded, and a second connection state in which the second contact is connected to the voltage lead-out point and the first contact is grounded; and a diode having a cathode to be connected to a voltage read-in point at which the resistor and the control device are connected to each other, and an anode to be grounded, wherein the control device determines the polarity of the battery based on a voltage at the voltage read-in point according to the connection state of the connection switching circuit, and a forward voltage of the diode is set so that the voltage at the voltage read-in point is not less than a lower limit value of an absolute maximum rating of the control device.

The battery polarity determination circuit is controlled so that each of the electrode terminals of the battery accommodated in the battery accommodating unit is connected to the voltage lead-out point or the ground by the connection switching circuit, and a connecting direction of the battery in the battery accommodating unit, that is, a battery polarity is determined based on the voltage at the voltage read-in point as a connection point between the resistor and the diode which are connected in series between the voltage lead-out point and the ground. At this time, the forward voltage of the diode is set so that the anode is grounded, the cathode is connected to the voltage read-in point, and the voltage at the voltage read-in point is not less than the lower limit value of the absolute maximum rating of the control device.

Therefore, the battery polarity determination circuit can be configured as low cost as compared with circuits using relatively expensive electronic components such as a photocoupler and an operational amplifier because the circuit configuration for determining the battery polarity consists of only relatively inexpensive elements such as a resistor and a diode, and also the mounting area of the battery polarity determination circuit on the circuit board can be reduced, which can contribute to miniaturization. Further, a voltage exceeding the absolute maximum rating is prevented from being input to the control device regardless of the connecting direction of the battery. Therefore, according to the battery polarity determination circuit of the first aspect of the present disclosure, the battery polarity can be determined at low cost while reducing the risk of damage.

A second aspect of the present disclosure is a battery polarity determination circuit in which the diode is a Schottky barrier diode in the first aspect of the present disclosure described above.

According to the battery polarity determination circuit of the second aspect of the present disclosure, a voltage drop at the voltage read-in point can be suppressed by the Schottky barrier diode having a lower forward voltage among rectifying elements, so that it is possible to further reduce the risk that the control device is damaged due to the voltage input to the control device.

A third aspect of the present disclosure is a battery polarity determination circuit in which a resistance value of the resistor is set so that current flowing from the diode does not exceed an allowable current of the diode in the first or second aspect of the present disclosure described above.

According to the battery polarity determination circuit of the third aspect of the present disclosure, since the resistance value of the resistor is set so that the current exceeding the allowable current does not flow through the diode, it is possible to reduce the risk of damage which is caused by the current input to the diode.

A fourth aspect of the present disclosure is a battery polarity determination circuit in which the control device performs an abnormality determination on the battery when the voltage at the voltage read-in point is not within a predetermined voltage range in both the first connection state and the second connection state in any one of the first to third aspects of the present disclosure described above.

According to the battery polarity determination circuit of the fourth aspect of the present disclosure, since the voltage of the battery can be read by switching the connection state between the battery and the control device with the connection switching circuit, the battery can be prevented from being charged under an abnormal state in which the voltage of the battery is not within the predetermined voltage range.

A fifth aspect of the present disclosure is a charger comprising the battery polarity determination circuit according to any one of the first to fourth aspects of the present disclosure, and a power supply circuit for outputting charging power for charging the battery to the voltage lead-out point based on control by the control device, wherein after determining the polarity of the battery, the control device charges the battery in a connection state where the voltage at the voltage read-in point is equal to the voltage of the battery in the first connection state or the second connection state.

According to the charger of the fifth aspect of the present disclosure, after the polarity of the battery is determined by the battery polarity determination circuit, charging can be performed in an appropriate connection state between the power supply circuit and the battery, and the cost can be reduced while reducing the risk of damage.

A sixth aspect of the present disclosure is a charger in which the control device causes the battery to discharge until a discharge end voltage under a reverse bias connection state in which a positive electrode terminal of the battery is grounded in the first connection state or the second connection state during a period of time from determination of the polarity of the battery until start of charging in the fifth aspect of the present disclosure described above.

When the charger according to the sixth aspect of the present disclosure is controlled to be in a connection state in which the positive electrode terminal of the battery is grounded in the first connection state or the second connection state according to the circuit configuration of the battery polarity determination circuit, a closed circuit in which a battery capacity of the battery is consumed in a resistor is formed. Therefore, according to the charger of the sixth aspect of the present disclosure, refresh discharge of the battery can be performed without adding a new configuration during a period of time from determination of the polarity of the battery until start of charging.

A seventh aspect of the present disclosure is a charger in which the control device controls a discharge current of the battery by PWM control for switching between the reverse bias connection state and an open state in which both the first contact and the second contact are opened in the sixth aspect of the present disclosure described above.

According to the charger of the seventh aspect of the present disclosure, the discharge current of the battery can be controlled by PWM control for the connection switching circuit, and it is possible to perform refresh discharge suitable for the characteristics of the battery.

An eighth aspect of the present disclosure is an electronic device comprising the battery polarity determination circuit according to any one of the first to fourth aspects of the present disclosure, and a load device that operates with discharge power of the battery which is output to the voltage lead-out point, wherein after determining the polarity of the battery, the control device causes the battery to discharge in a connection state where the voltage at the voltage read-in point is equal to a voltage of the battery in the first connection state or the second connection state.

In the electronic device according to the eighth aspect of the present disclosure, the battery can be discharged in an appropriate connecting direction after the polarity of the battery has been determined even when the battery accommodated in the battery accommodating unit is oriented in any direction. Further, in the electronic device, the circuit for determining the polarity of a battery consists of only relatively inexpensive elements, and a voltage exceeding the absolute maximum rating is prevented from being input to the control device. As a result, according to the electronic device of the eighth aspect of the present disclosure, the battery polarity can be determined at low cost while reducing the risk of damage.

EXPLANATION OF REFERENCE SIGNS 1 charger
2 battery accommodating unit
3 control device
4 connection switching circuit
5 power supply circuit
10 electronic device
20 load device
BAT battery
T1 to T2 first to second contacts
SW1 to SW4 first to fourth switches
R resistor
D diode
P1 voltage lead-out point
P2 voltage read-in point

The invention claimed is:

1. A battery polarity determination circuit comprising:
a battery accommodating unit including a first contact and a second contact configured to be in contact with respective electrode terminals of a battery accommodated in the battery accommodating unit;
a control device that is connected via a resistor to a voltage lead-out point at which a voltage of the battery is led out from the battery accommodating unit and determines a polarity of the battery accommodated in the battery accommodating unit;
a connection switching circuit capable of switching between a first connection state in which the first contact is connected to the voltage lead-out point and the second contact is grounded, and a second connection state in which the second contact is connected to the voltage lead-out point and the first contact is grounded; and
a diode having a cathode to be connected to a voltage read-in point at which the resistor and the control device are connected to each other, and an anode to be grounded,
wherein the control device determines the polarity of the battery based on a voltage at the voltage read-in point according to the connection state of the connection switching circuit, and
wherein a forward voltage of the diode is set so that the voltage at the voltage read-in point is not less than a lower limit value of an absolute maximum rating of the control device.

2. The battery polarity determination circuit according to claim 1, wherein the diode is a Schottky barrier diode.

3. The battery polarity determination circuit according to claim 1, wherein a resistance value of the resistor is set so that current flowing from the diode does not exceed an allowable current of the diode.

4. The battery polarity determination circuit according to claim 1, wherein the control device performs an abnormality determination on the battery when the voltage at the voltage read-in point is not within a predetermined voltage range in both the first connection state and the second connection state.

5. A charger comprising:
the battery polarity determination circuit according to claim 1; and
a power supply circuit for outputting charging power for charging the battery to the voltage lead-out point based on control by the control device,
wherein after determining the polarity of the battery, the control device charges the battery in a connection state where the voltage at the voltage read-in point is equal to the voltage of the battery in the first connection state or the second connection state.

6. The charger according to claim 5, wherein the control device causes the battery to discharge until a discharge end voltage under a reverse bias connection state in which a positive electrode terminal of the battery is grounded in the first connection state or the second connection state during a period of time from determination of the polarity of the battery until start of charging.

7. The charger according to claim 6, wherein the control device controls a discharge current of the battery by PWM control for switching between the reverse bias connection state and an open state in which both the first contact and the second contact are opened.

8. An electronic device comprising:
the battery polarity determination circuit according to claim 1; and
a load device that operates with power of the battery which is output to the voltage lead-out point,
wherein after determining the polarity of the battery, the control device causes the battery to discharge in a connection state where the voltage at the voltage read-in point is equal to a voltage of the battery in the first connection state or the second connection state.

* * * * *